United States Patent
Colonna

(10) Patent No.: US 8,338,276 B2
(45) Date of Patent: Dec. 25, 2012

(54) MANUFACTURING METHOD FOR A NANOCRYSTAL BASED DEVICE COVERED WITH A LAYER OF NITRIDE DEPOSITED BY CVD

(75) Inventor: Jean-Philippe Colonna, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 5 days.

(21) Appl. No.: 12/570,869

(22) Filed: Sep. 30, 2009

(65) Prior Publication Data

US 2010/0035415 A1 Feb. 11, 2010

Related U.S. Application Data

(63) Continuation of application No. 11/956,902, filed on Dec. 14, 2007, now abandoned.

(30) Foreign Application Priority Data

Dec. 15, 2006 (FR) ...................................... 06 55561

(51) Int. Cl.
 *H01L 21/20* (2006.01)
 *H01L 21/36* (2006.01)
(52) U.S. Cl. .................... 438/479; 257/E21.09; 977/813
(58) Field of Classification Search .................. 438/479; 257/315, E21.09, E21.17, E29.322
 See application file for complete search history.

(56) References Cited

U.S. PATENT DOCUMENTS 5,330,936 A * 7/1994 Ishitani .......................... 438/791

(Continued)

FOREIGN PATENT DOCUMENTS

EP 1 426 328 6/2004
WO WO 2006/007069 1/2006

OTHER PUBLICATIONS

Masaki Yoshimaru, et al.; "Effects of Deposition Temperature on the Oxidation Resistance and Electrical Characteristics of Silicon Nitride"; IEEE Transactions of Electron Devices 41, XP000469646, Oct. 1994, pp. 1747-1752.

(Continued)

*Primary Examiner* — Leonard Chang
*Assistant Examiner* — Calvin Choi
(74) *Attorney, Agent, or Firm* — Oblon, Spivak, McClelland, Maier & Neustadt, L.L.P.

(57) ABSTRACT

The present invention relates to methods of manufacturing a structure having semi-conductor material nanocrystals on a dielectric material substrate by chemical vapour deposition (CVD), the method including at least: i) contacting a surface of a dielectric layer present on a substrate with a first gaseous precursor, by CVD, to form nanocrystal nuclei on the surface of a the dielectric layer; ii) contacting the nanocrystal nuclei with a second gaseous precursor, by CVD, to selectively deposit nanocrystal semi-conductor material only on the nuclei and to grow nanocrystals on the nuclei, each nanocrystal having an exposed surface; and iii) forming a nitride layer only on the exposed surface of each nanocrystal by contacting the nanocrystals with a mixture including at least the second gaseous precursor and a third gaseous precursor to terminate the growth of said nanocrystals and to selectively and stoichiometrically deposit the nitride layer on the exposed surface, wherein a material of said nanocrystal nuclei is compatible with a material of said dielectric layer, each of i), ii) and iii) are carried out in a same chamber, and the first gaseous precursor, the second gaseous precursor and the mixture of the second gaseous precursor with the third gaseous precursor are introduced into the chamber in a continuous flow.

20 Claims, 1 Drawing Sheet

U.S. PATENT DOCUMENTS

| | | | |
|---|---|---|---|
| 6,297,095 B1 * | 10/2001 | Muralidhar et al. | 438/257 |
| 6,946,369 B2 * | 9/2005 | Mazen et al. | 438/478 |
| 2005/0258467 A1 | 11/2005 | Wang et al. | |
| 2007/0253257 A1 * | 11/2007 | Wang | 365/185.29 |

OTHER PUBLICATIONS

B. De Salvo, et al.; "How far will Silicon nanocrystals push to scaling limits of NVMs technologies?"; IEEE, 2003, 4 pages.

F. Mazen, et al.; "A two steps CVD process for the growth of silicon nano-crystals"; Applied Surface Science 214, 2003, pp. 359-3632003.

K.C. Scheer, et al.; "Thermal oxidation of silicon nanocrystals in O2 and NO ambient"; Journal of Applied Physics, vol. 93; No. 9, May 1, 2003, pp. 5637-5642.

Shaoyun Huang, et al.; "Toward Long-Term Retention-Time Single-Electron-Memory Devices BAsed on Nitrided Nanocystalline Silicon Dots"; IEEE Transactions on Nanotechnology, vol. 3; No. 1, Mar. 2004; pp. 210-214.

Sucharita Madhukar, et al.; "CVD growth of Si nanocrystals on dielectric surfaces for nanocrystals floating gate memory application"; Mat. Res. Soc. Symp. Proc. vol. 638, 2001 XP008019824, 6 pages.

* cited by examiner

MANUFACTURING METHOD FOR A NANOCRYSTAL BASED DEVICE COVERED WITH A LAYER OF NITRIDE DEPOSITED BY CVD

CROSS REFERENCE TO RELATED APPLICATION

This application is a continuation of U.S. application Ser. No. 11/956,902, filed on Dec. 14, 2007 now abandoned, and claims priority to French Patent Application No. 06 55561, filed on Dec. 15, 2006.

TECHNICAL FIELD

The invention relates to a manufacturing method for a device comprising nanocrystals, of determined size and density, covered with a layer of nitride deposited by CVD. The method permits, in particular, memory cells to be obtained to make flash memories.

STATE OF THE PRIOR ART

Flash memories use field effect transistors as their base cells. These transistors feature a floating gate located between the channel and the control gate of the transistor, as well as a tunnel dielectric located between the channel of the transistor and the floating gate.

The floating gate is the element which stores the information. In the current MOS (Metal Oxide Semiconductor) technology the floating gate is made of n-doped polycrystalline silicon.

The tunnel dielectric is generally a thermal silicon oxide ($SiO_2$). It is via this oxide that the loads are injected from the channel to the floating gate.

In recent years, the capacities of flash memories have increased continually with the constant reduction of the elementary cells involved in the miniaturisation of the devices. This race for the density of integration and the reduction in the operation times have allowed the density of 64 Mbits memories in 1997 to be increased to 512 Mbits at present for NOR flash memories, and 2 Gbits for NAND flash memories currently produced by Samsung in 90 nm technology. Prototypes of 8 Gbits NAND flash memories in 63 nm technology using the MLC (Multi-Level-Cell) technique were also presented by Samsung at the end of 2004.

However, several technological obstacles start to bar the continuation of the increase in the capacities of the flash memories and their miniaturisation. Indeed, the reduction of the dimensions of the flash memories is accompanied by a reduction in the thicknesses of the dielectrics, especially the gate oxide. According to the ITRS 2004, the thicknesses of tunnel oxides in 2007 will be 8-9 nm for NORs and 6-7 nm for NANDs. Unfortunately, the reduction in the thickness of the tunnel oxide, in particular below 8 nm, gives rise to an increase in the leakage currents through it due to the direct tunnel effect or by defects in this oxide, caused by the repetition of writing and erasing stresses (phenomenon called SILC: "Strain Induced Leakage Current"). The retention, which is to say all of the information stored in periods of ten years, is then affected.

Another major problem is the reduction of the operating voltages to reduce the energy consumption and to be closer to the low operating voltages (1 to 2 Volts) of the CMOS (Complementary MOS) logic transistors.

To overcome these difficulties, new architectures and new materials are today being studied for flash memories.

One of the solutions adopted consists in replacing the polycrystalline silicon floating gate with discrete trap sites in the flash memories. One of the advantages of a floating gate with discrete trap sites is the electrical insulation between the trap sites. Consequently, the presence of a defect in the tunnel oxide, which causes complete discharge in the case of a continuous floating gate device, will only affect the load situated upstream of the defect. This structure therefore reduces the effect of the SILC and allows the thickness of the tunnel dielectric to be reduced while preserving good retention and endurance properties. In the discrete trap site memories, it is also possible to code two bits (or four states), thanks to the localised nature of the load stored.

One example of discrete storage site memories is represented by the silicon nanocrystal memories. In silicon nanocrystal memories, the load is stored in the silicon nanocrystals (whose size is between a few nanometres to about ten nanometres), which are situated between the tunnel dielectric and the control dielectric.

As seen above, nanocrystal memories are more robust to defects in the tunnel oxide compared with continuous floating gate memories and therefore permit the thickness of the tunnel oxide to be reduced and consequently, the writing and erasing voltages or the programming times can be reduced. The thickness of the tunnel oxide may then be reduced to as little as 5 nanometres, without critically downgrading the retention properties, even after a large number of writing/erasing cycles. The parasite phenomena such as capacitive coupling between the floating gate and the drain, and the lateral coupling between neighbouring gates, two phenomena that can cause parasite writing of neighbouring cells, are also reduced. Furthermore, due to the discrete nature of the floating gate, the storage of several bits may be envisaged inside a same cell.

Since their first presentation in 1995 by IBM, silicon nanocrystal memories have undergone huge developments. Recently, the Freescale company presented a 4 Mbit memory, using 90 nm technology and operating with programming voltages of less than 6 volts.

However, nanocrystal memories also have their limits.

In particular, these memories have low capacitive coupling between the control gate and the floating gate, which therefore requires the programming voltages to be maintained at a high level and which partially reduces the advantages related to the reduction of the tunnel oxide.

Another limit is that the threshold voltage offsets obtained with these devices are quite low, mainly due to the low cover rate of the active surface by the silicon nanocrystals (between $5 \times 10^{11}$ and $10^{12}$ per $cm^2$ with a LPCVD ("Low Pressure Chemical Vapour Deposition") deposition method that is widely used at present for these memories).

Another disadvantage is the dispersion of the size and the position of the nanocrystals on the tunnel oxide, which causes a dispersion of the memory characteristics. Nevertheless, a recent study showing a 1 Mbit matrix, manufactured by ST Microelectronics with the CEA-LETI (see document [1]), permitted a density of nanocrystals to be obtained equal to $2 \times 10^{12}$ $cm^{-2}$ with devices with a programming window of 3 Volts, which complies with the requirements needed for flash memories. Furthermore, this study shows, by using a model which quantifies the threshold voltage dispersion, that these memories satisfy the requirements in terms of performance for the integration up to the 65 nm technological node for NAND type applications and 35 nm for NOR type applications.

One of the methods of making nanocrystals is described in the document [2]. It is a two step CVD (Chemical Vapour Deposition) method, which permits the nucleation step to be dissociated from the growth step of the nanocrystals. This method permits a reduction in the dispersion in size of the nanocrystals compared to a standard CVD method using a single step. This method has especially been used to develop a maximum cover rate of approximately 30% (see document [1]). The size of the nanocrystals obtained is less than 10 nm and their density is $2\times10^{12}$ per $cm^2$. This density corresponds to the limit density obtained before coalescence, wherein the coalescence is the point where the islands, formed by the nanocrystals, start to join together to form a continuous layer.

Another major difficulty posed by nanocrystal devices lies in their integration with the other manufacturing steps of flash type memories. The problem here is that of the oxidation of the silicon nanocrystals during the subsequent steps, which are potentially oxidising, but also their oxidation with the ambient air. To prevent this oxidation, the silicon nanocrystals need to be passivated, which is to say to protect them from any oxidising effect that could diffuse to their silicon/dielectric control interface.

In the literature, various sorts of passivation can be found.

For example, the Freescale company uses NO annealing, which consumes the outer layer of the nanocrystals to form an oxynitride. The presence of nitride then forms a barrier to future oxidations (see document [3]).

Plasma nitriding may also be used to form a layer of silicon nitride at the surface of the silicon nanocrystals (see document [4]).

The first problem posed by these two passivation techniques, NO annealing and plasma nitriding, is that they consume silicon nanocrystals during the formation of the passivation layer. Indeed, the passivation layer is not a deposited layer, but a layer formed from the silicon of the nanocrystals themselves. For example, for nanocrystals whose diameter is less than 10 nm, with a passive layer of 2 nm and a silicon "core" of 6 nm (for nanocrystals of a total diameter of 10 nm), the passivation layer represents 40% of a nanocrystal, which is a large reduction of the "useful" nanocrystals in terms of storage (which is to say the remaining part of the silicon).

The second problem posed by these two passivation techniques relates to the tunnel dielectric, or more specifically the tunnel oxide. Indeed, during passivation, there is a risk of nitriding the tunnel oxide, which is not necessarily a problem, but care must however be taken to avoid downgrading the electrical properties of this tunnel oxide.

A third problem is the formation of a native oxide at the surface of the nanocrystals. Indeed, it may be considered that a native oxide will be formed at the surface of the nanocrystals if they are exposed to the atmosphere, after deposition and before the formation of the passivation layer. This oxide is therefore added to the passivation layer.

In the case of NO annealing, an oxynitride is formed whose Nitrogen concentration is higher the closer it is to the Si/SiOx interface. However, it is this Nitrogen rich interface which protects the silicon nanocrystals by forming a real barrier to the oxidation. Indeed, the high concentration of Nitrogen permits the formation of many Si—N bonds which retard the diffusion of the oxidising species. It may therefore be understood that the external part of the passivation layer, which may be described as SiOx with a low Nitrogen concentration, consumes the silicon of the nanocrystals without however forming a barrier to the oxidation. Consequently, only the Si/SiOx interface Nitrogen rich forms the useful part of the passivation layer, while the rest of the layer consumes the silicon of the nanocrystals in pure loss. Consequently, this method of passivation by annealing in an NO atmosphere may only be used for nanocrystals of large diameters. An EFTEM image in document [3] provides the following dimensions: the NO passivation layer represents 3 nm and the silicon core has a diameter of 11.5 nm, which corresponds to a nanocrystal of 17.5 nm (3×2+11.5). However, according to document [1], nanocrystals of this dimension do not permit in practice cover rates to be obtained that are sufficient to obtain a satisfactory threshold voltage offset with low dispersion.

Another major effect of the annealing with a NO atmosphere is the nitriding of the tunnel oxide. This depends on the thickness of the tunnel oxide and the thermal budget of the annealing. The mechanism is the same as for nitriding the nanocrystals: diffusion through the oxide and dissociation of the NO molecule at the $Si/SiO_2$ interface. A thin tunnel oxide and a high thermal budget for the NO annealing thus cause nitriding of the Si/tunnel oxide interface. This is not necessarily a problem if the oxide is not damaged, but the electrical properties of the tunnel oxide are modified.

In the case of plasma nitriding, document [4] provides the following conditions: use of Nitrogen plasma (RF=13.56 and Power=2.6 $W/cm^3$) for 20 minutes at 800° C., which leads to the formation of a silicon nitride 1 nm thick at the surface of the nanocrystals. To evaluate the consumption of the silicon of the nanocrystals, it is necessary to know if there is a formation of a native oxide or not at the surface of the nanocrystals, or in other terms, if the nanocrystals have been exposed to the atmosphere before being nitrided. Indeed, a native oxide consumes approximately 0.5 nm of silicon on the radius of a nanocrystal, which is to say 1 nm on the diameter, to which 1 nm of nitride has to be added. Therefore in total 2 nm of silicon are consumed on a nanocrystal of 8 nm diameter. In the hypothesis where there is a formation of a native oxide at the surface of the nanocrystals, it is estimated that the native oxide exposed to Nitrogen plasma in the conditions described in document [4] would be entirely etched before the plasma starts to nitride the silicon nanocrystals. This is a positive point for the passivation of the nanocrystals, but poses a real problem for the tunnel oxide. Indeed, it is thought that Nitrogen plasma treatment is detrimental to the reliability of the tunnel oxide. Furthermore, the operating conditions required for the plasma nitriding (which is to say 20 minutes at 800° C. for single plate equipment) are not conditions easily used in an "industrial" orientated method.

In view of the disadvantages described above, the purpose of the invention is to obtain a method which permits passivated nanocrystal devices to be obtained, in particular silicon nanocrystal flash memories having the following characteristics:
- the nanocrystals have a size and density such that there is maximum cover rate on the dielectric;
- the passivation is carried out without the nanocrystals being exposed to an oxidising atmosphere;
- the passivation forms an effective barrier against oxidation (the passivation must provide good resistance to the later oxidising methods);
- the passivation does not consume the nanocrystals, so that the initial size of the nanocrystals is preserved and consequently there is a maximum cover rate;
- the passivation layer does not damage the existing materials such as the tunnel dielectric.

DESCRIPTION OF THE INVENTION

This purpose is achieved by a CVD ("Chemical Vapour Deposition") method comprising both the creation of the nanocrystals of determined size and density and their passivation, in the form of stoichiometric nitride deposition only located on the nanocrystals. It is therefore possible to make silicon nanocrystals covered with a layer of silicon nitride.

The method according to the invention is a manufacturing method for a structure comprising semi-conductor material nanocrystals on a dielectric material substrate by chemical vapour deposition (CVD), the nanocrystals being covered by a layer of semi-conductor material nitride, said method comprising:
- a germination step by the formation on the dielectric material substrate of stable nuclei in the form of islands, by CVD from a first gaseous precursor of the nuclei selected so that the dielectric material accepts the formation of said nuclei,
- a growth step by the formation of semi-conductor material nanocrystals from the stable nuclei, by CVD from a second gaseous precursor selected to cause selective deposition of said nanocrystal semi-conductor material only on said nuclei,
- a passivation step by the formation of a layer of semi-conductor material nitride on the semi-conductor material nanocrystals,
- wherein said method is characterised in that the passivation step is realised by selective and stoichiometric CVD of semi-conductor material nitride only on the semi-conductor material nanocrystals from a mixture of the second gaseous precursor with a third gaseous precursor selected so that the mixture is capable of causing selective and stoichiometric deposition of the semi-conductor material nitride only on said semi-conductor material nanocrystals, the steps of forming the nuclei, forming the nanocrystals and passivation being carried out inside a same, single chamber.

The chemical vapour deposition (CVD) may especially be carried out at low pressures, for example by LPCVD ("Low Pressure CVD") with a pressure of less than 2 Torrs or by RPCVD ("Reduced Pressure CVD") with a pressure of less than 20 Torrs and the addition of a carrier gas, for example $H_2$.

It is important for the nitride layer to be stoichiometric so that it can provide good resistance to the subsequent oxidising methods.

It should be noted that given that all of the steps are carried out inside a same chamber, the risks of contamination of the component parts of the device are eliminated.

Advantageously, the first gaseous precursor, the second gaseous precursor and the mixture of the second gaseous precursor with the third gaseous precursor are sent into the chamber in a continuous flow.

Advantageously, the method according to the invention further comprises a preparatory step of the surface of the dielectric material substrate, prior to the germination step, by chemical attack of said surface using HF, HF-RCA or RCA, so as to form groups —OH on the surface of said dielectric material substrate and thus favour the formation of the nuclei. For example, silane (and the derivatives of silane) decomposes on an OH site; cleaning the surface of the substrate by HF, HF-RCA or RCA therefore permits the number of OH sites present on the surface of the substrate on which the silane may decompose to be increased.

Advantageously, the dielectric material forming the substrate is a thermal oxide.

RCA cleaning is the standard industrial cleaning used to remove surface contamination. It is composed of two chemical baths SC1 and SC2 (for "Standard clean 1" and "Standard clean 2"). Prior to the RCA cleaning, it is possible to carry out HF cleaning (HF-RCA cleaning), which is to say a hydrofluoric acid bath which reacts with or removes the silica.

Advantageously, the dielectric material substrate is selected from the group composed of a silicon thermal oxide, a silicon oxide comprising a high density of Si—OH groups on its surface or a "high-K" material (which is to say a dielectric with high permittivity with a K of more than 6) such as $HfO_2$, $Al_2O_3$, hafnium aluminate or a hafnium silicate.

Advantageously, the semi-conductor material of the nanocrystals and/or of the nitride layer is selected from silicon, germanium or a germanium-silicon compound. Consequently, it is possible to form for example silicon nanocrystals covered with silicon nitride.

According to a first variant, the nanocrystals are made of silicon and the layer covering said nanocrystals is made of silicon nitride or germanium nitride.

According to a second variant, the nanocrystals are made of germanium and the layer covering said nanocrystals is made of silicon nitride.

Advantageously, the germination step is carried out at a deposition temperature and for an exposure time to the first gaseous precursor selected so as to obtain a density of nuclei greater than or equal to $10^{10}$ nuclei per $cm^2$ and nuclei with a size less than or equal to 10 nm.

Advantageously, the growth step of the nanocrystals is carried out at a deposition temperature, for an exposure time to the second gaseous precursor and at a partial pressure of the second gaseous precursor selected according to the desired size of the nanocrystals.

Advantageously, the first gaseous precursor (11) is selected from silane, disilane or trisilane.

Advantageously, the second gaseous precursor is selected from germanium ($GeH_4$), dichlorosilane (DCS or $SiH_2Cl_2$) or a mixture of these two gases.

According to one specific embodiment, the first and second gaseous precursors are respectively silane and dichlorosilane, wherein the temperature and the deposition time of the growth step are higher than the temperature and the deposition time of the germination step.

Advantageously, the third gaseous precursor (used in a mixture with the second gaseous precursor) is ammonia ($NH_3$).

Advantageously, as the dielectric material substrate is a thermal silicon oxide, the passivation step is carried out for a gas deposition time, formed from the mixture of the second gaseous precursor and the third gaseous precursor, of less than 8 minutes.

The invention also relates to a memory cell with a floating gate, characterised in that the floating gate is formed by nano-structures obtained according to the method of the invention, as well as to a flash memory comprising at least one such memory cell.

BRIEF DESCRIPTION OF THE DRAWINGS

The invention will be more clearly understood and other advantages and specific features will appear after reading the following description, provided by way of non-restrictive example, accompanied by appended drawings among which

DETAILED DESCRIPTION OF A SPECIFIC EMBODIMENT

Figure 1A:
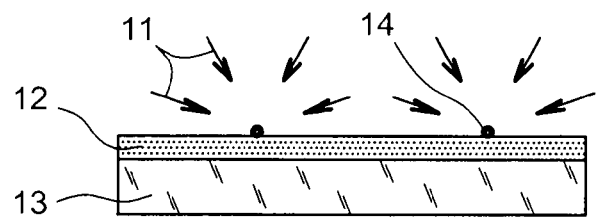
FIGS. 1A to 1E show the steps of the method according to the invention.

The method according to the invention comprises three steps:
- a germination step, a growth step of nanocrystals on the nuclei formed during the germination step,
- a passivation step of the nanocrystals.

The purpose of the germination step is to create "nuclei" on the dielectric around which the nanocrystals will grow. Given that the deposition is made on a dielectric, precursor must be used that is capable of depositing on this dielectric. For example, for a silicon oxide dielectric, silane $SiH_4$ may be used.

In order to limit as much as possible the dispersion in size of the nanocrystals and to obtain a density of nanocrystals greater than $10^{12}$ nuclei per square centimetre, a deposition time is selected that is sufficiently short so as to obtain a nucleus size no greater than 1 nm and sufficient to obtain the desired density (given that the nuclei density will be equivalent to the nanocrystal density, given that the nanocrystals grow on the nuclei). For example, a deposition time may be chosen of between a few seconds to a few minutes, for example 10 seconds to 10 minutes.

A deposition temperature is also selected that is sufficient so that the gaseous precursor can dissociate. If crystalline nuclei are to be obtained, the deposition temperature must be sufficient so that a crystalline and not an amorphous deposition is obtained. It should be noted that the deposition temperature and the time are difficult to dissociate and the choice of one has an effect on the other. The temperature may be between 550 and 650° C., for example 600° C.

Finally, a partial pressure of the gaseous precursor of the nuclei is chosen that is relatively high, which is to say a pressure of between 10 mTorr and 1 Torr, so as to obtain a high nuclei density. The partial pressure may for example be 60 mTorr.

It may be noted that during the germination step, two rival phenomena occur. In one hand, there is the creation of the nuclei and in the other hand, there is the growth of the nanocrystals around the existing nuclei. The choice of the germination parameters, such as the deposition time and temperature, as well as the partial pressure of the gaseous precursor are made in order to try to limit the second phenomenon. Consequently, a deposition time will be chosen that is short enough to limit the second phenomenon of the growth around the nuclei.

To limit the second phenomenon, it is also possible to prepare the dielectric surface in order to favour considerably the creation of nuclei with respect to the growth around the existing nuclei.

The growth step permits the nanocrystals to be grown from nuclei to the desired size, without creating new nanocrystals. The gaseous precursor of the nanocrystals is selected so that it dissociates on the existing nuclei, but not on the dielectric. The size of the nanocrystals is limited by what is called the coalescence (the point where the islands start to join together to form a continuous layer) and the density of the nanocrystals is consequently determined during the previous germination step. Therefore a selective gaseous precursor and a controlled speed of growth are chosen to obtain the desired size of nanocrystals. For example, as gaseous precursor selective dichlorosilane (DCS), germanium $GeH_4$ or a mixture of them may be selected. The growth time and temperature are selected so as to obtain the desired size of nanocrystals.

The partial pressure of the gaseous precursor(s) of the nanocrystals is also selected according to the size of the nanocrystals and therefore according to the desired speed of growth. For example, in the case of silicon nanocrystals, for the DCS gaseous precursor, a temperature in general greater than that of the germination step (between 600 and 850° C. for example), a deposition time also greater than that of the germination step (several minutes) and a partial pressure lower than or equal to that of the germination step will be selected.

The passivation step consists of depositing a protective layer on the nanocrystals, so that the latter do not oxidise. As seen above, the ideal material to form an effective barrier to oxidation is silicon nitride. Furthermore, it is preferred that the passivation layer is only situated on the nanocrystals. Therefore the deposition must be selective, in order for the deposition to take place only on the nanocrystals, and not on the dielectric. Therefore one or several selective gaseous precursors must be chosen. To deposit silicon nitride, the selective gaseous precursor may be DCS to which ammonia $NH_3$ is added to form a mixture. To deposit germanium nitride, the selective gaseous precursor may be $GeH_4$ or $GeCl_4$ to which ammonia $NH_3$ is added to form a mixture.

The layer of silicon nitride must cover the nanocrystals and be capable of acting as a barrier to the oxidation, but also be thin enough, or to last for a short enough period of time, to avoid the growth of the silicon nitride on the dielectric.

A thick nitride forms an effective barrier to oxidation as the oxidising species are blocked by the nitride and only the surface of the nitride layer oxidises. But below a certain thickness (called the critical thickness), the oxidising species pass through the nitride layer and oxidise the nanocrystal under the nitride. This critical thickness is around a few nanometres and depends on several factors, in particular the temperature and the selectivity of the nitride deposition.

For a LPCVD nitride deposited at 600° C., the critical thickness is 3 nm and is 5 nm for a nitride deposited at 750° C. (see document [5]). These results are explained by the presence of a non-stoichiometric (Si-rich) sub-layer, called the transition layer, when the nitride is deposited on an oxide or silicon with a native oxide on its surface. Indeed, it is this non-stoichiometric transition layer that has a low resistance to the oxidation and the thickness of this sub-layer depends on the deposition temperature.

The selectivity of the nitride deposition is frequently designated in the literature by "nucleation delay" or "incubation period". This incubation period is at its maximum when nitride is deposited on thermal oxide, it remains significant on silicon with a native oxide on its surface, it decreases if the nitride is deposited on nitride (with a surface oxidised by air) and further decreases if the deposition is made on a silicon or deoxidised nitride surface (generally obtained by HF cleaning). For standard LPCVD nitride deposition conditions, in the literature a delay of approximately 8 minutes is found on a thermal oxide, then approximately 5 minutes on silicon with native oxide on its surface, and finally, on silicon with a deoxidised surface or bare silicon, this delay is virtually reduced to zero. This is explained by the various states of the surface, more or less favourable to nucleation. Consequently, a thermal oxide has siloxane —Si—O—Si— bonds at the surface, which is the most unfavourable case for nucleation, the intermediate case corresponds to a majority of silanol Si—OH bonds for the native oxide and the most favourable case is the Si—H bond on bare silicon. Thus selective nitride deposition is obtained if these conditions are used, wherein the most favourable case is a surface with bare silicon against a thermal oxide, with deposition time of less than 8 minutes.

Furthermore, it has been seen that a nitride deposited on oxide or silicon with native oxide at the surface has a non-stoichiometric sub-layer, called the transition layer, of between 3 and 5 nm according to the deposition temperature. In the case of nitride deposition on deoxidised silicon, this transition sub-layer disappears (or tends to disappear) to make way for a directly stoichiometric layer.

As seen above (see document [5]), a stoichiometric nitride has very good resistance to oxidation and a thin nitride of 2 nm deposited on deoxidised silicon forms a barrier to the oxidation that is sufficiently effective to resist oxidation at 850° C., regardless of whether the nitride film is deposited at 650° C. or at 750° C.

In view of the above, it may be seen that a silicon nitride 2 nm thick may be sufficiently effective to protect silicon nanocrystals if the deposition is stoichiometric, which is to say made on bare silicon. It is therefore important for the nitride deposition to be a stoichiometric deposition. As concerns the selectivity of the deposition, the most favourable conditions are selected, which is to say bare silicon against thermal oxide and a deposition time of less than 8 minutes. If these conditions are respected, the nitride deposition conditions are those of a standard nitride deposition, which is to say that the temperature may be the same as that of the growth step of the nanocrystals (in the range of 600-850° C. for example), the partial pressures and the DCS/NH$_3$ ratio are those of a standard LPCVD nitride deposition. Only the deposition time, which must imperatively be less than 8 minutes to obtain selective deposition, and the total pressure, which permits the growth speed to be controlled and consequently the thickness of the nitride deposited (around 2-3 nm for example), must be adjusted.

By way of example, we will describe the embodiment of silicon nanocrystals on a thermal oxide dielectric substrate, wherein the nanocrystals are coated with silicon nitride.

On a silicon substrate, a layer of thermal oxide is formed. The thermal oxide substrate is placed in the chamber of a technological frame. The chamber is progressively heated to the germination temperature, according to a temperature ramp in an atmosphere of inert gas (Nitrogen N$_2$ or hydrogen H$_2$).

Preferably, the substrate undergoes surface cleaning prior to the germination so as to favour a specific surface condition. For example, the thermal oxide substrate may undergo surface chemical cleaning with a HF solution so as to favour the silanol (—OH) terminations, which form the preferred nucleation sites for the silicon nanocrystals.

During the germination step, a gaseous precursor 11 is sent onto the substrate 13 covered by a dielectric layer 12, which will permit the formation of nuclei 14 on the dielectric 12 (FIG. 1A). The silicon nuclei 14 may be formed at a temperature of between 550° C. and 700° C. and at a partial pressure of silane less than approximately 133 Pa (1 Torr). The deposition temperature interval is selected so that the temperature is high enough so that the precursor may dissociate and cause the formation of a crystalline nucleus, and also as low as possible in order to limit the growth speed of the nuclei.

In this case, a germination temperature of 600° C. and a partial pressure of 60 mT are chosen. The temperature is thus increased up to 600° C., then the germination step is started by injecting 60 cc of silane gas in the chamber, for 30 s, at a pressure of 60 mT: silicon nuclei are thus deposited on the thermal oxide substrate.

Figure 1B:
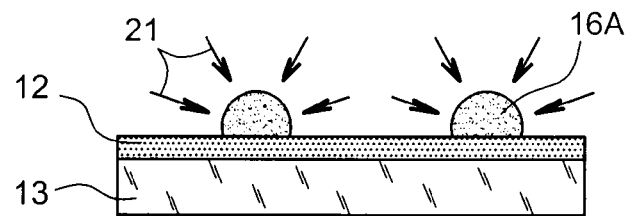
Figure 1C:
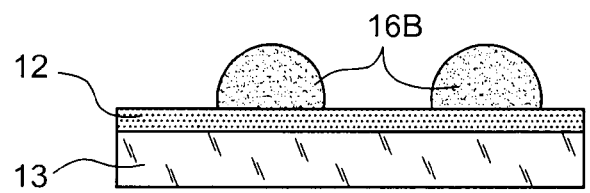

The germination step is followed by a selective growth step of silicon nanocrystals on the nuclei. A gaseous precursor 21 of the nano-structures 16A that are to be obtained, which is to say silicon nano-structures, is sent and they will selectively grow on the nuclei 14 formed during the germination step (FIG. 1B). The nanocrystals will grow until they reach a determined size at the end of the growth step, the size of the nanocrystals being determined by the choice of the deposition time and temperature of the growth step, as well as by the partial pressure of the gaseous precursor used: nanocrystals of homogenous size 16 B (FIG. 1C) are thus obtained. In our example of embodiment, 60 cc of a dichlorosilane DCS gas are injected at a pressure of 60 mT, while progressively increasing the temperature from 600 to 700° C. during 10 minutes.

With a RPCVD method, the increase in temperature takes a few seconds to pass from 600° C. to 700° C. A specific step needs to be added for the growth of the nanocrystals with dichlorosilane for a few minutes at 700° C.

Figure 1D:
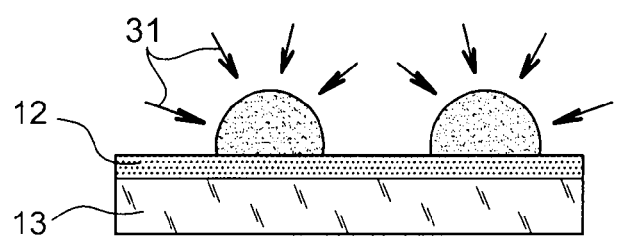
Figure 1E:
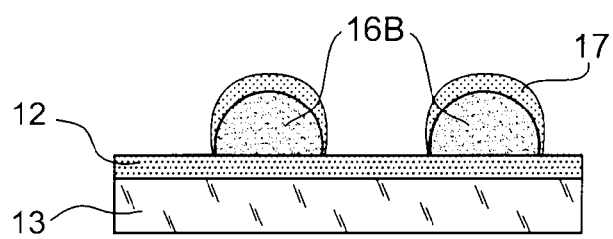

Then, the silicon nanocrystals 16B are encapsulated by injecting a mixture of gaseous precursors 31 composed of 0.2 slm of NH$_3$ and 40 cc of DCS, at a pressure of 220 mT, at a temperature of 700° C. and during 5 minutes (FIG. 1D). A selective and stoichiometric nitride deposition 17 is thus obtained on the silicon nanocrystals 16B (FIG. 1E).

Finally, the temperature in the chamber is lowered to ambient temperature, according to a temperature ramp in inert Nitrogen gas.

A device is thus obtained composed of a substrate 13 comprising a thermal oxide layer 12 and silicon nanocrystals 16B coated with silicon nitride 17. The nanocrystals have a silicon core of between 6 and 8 nm. The silicon nitride layer has a thickness of approximately 2 nm. The density of the nanocrystals is approximately $10^{12}$ nanocrystals per cm$^2$.

Advantageously, gases used in the manufacturing method of the silicon nanocrystals on the thermal oxide dielectric substrate are sent into the chamber in a continuous flow: there is consequently a continuous flow of different successive gases inside a same chamber during the method.

The formation of nanocrystals on a dielectric and protected by a layer of nitride may be useful in the production of flash memories.

For this purpose, silicon nanocrystals on the silicon oxide dielectric are made as explained above and the silicon nanocrystals are covered with silicon nitride. The other steps for forming flash memories (especially the formation of the tunnel oxide and the control gate) are similar to the traditional formation steps.

BIBLIOGRAPHY

[1] B. De Salvo and al, "How far will Silicon Nanocrystals push the scaling limits of NVMs technologies?", Technical Digest of IEEE International Electron Devices Meeting 2003, pp. 597-600, Washington, D.C., Dec. 7-10, 2003.

[2] F. Mazen and al, "A two step process for the growth of silicon nano-crystals", Applied Surface Science 214, p 359-363, March 2003.

[3] K. C. Scheer and al., "Thermal oxidation of silicon nanocrystals in O$_2$ and NO ambient", Journal of Applied Physics, vol. 93, No. 9, 1 May 2003.

[4] S Huang and al., "Toward Long-Term Retention-Time Single-Electron-Memory Devices Based on Nitrided Nanocrystalline Silicon Dots", IEEE Transactions on Nanotechnology, vol. 3, No. 1, March 2004.

[5] M Yoshimaru and al., "Effects of Deposition Temperature on the Oxidation Resistance and Electrical Characteristics of Silicon Nitride", IEEE Transactions on Electron Devices, vol 41, No. 10, October 1994.

The invention claimed is:

1. A method of manufacturing a structure comprising semiconductor material nanocrystals on a dielectric material substrate by chemical vapour deposition (CVD), said method comprising:
   i) contacting a surface of a dielectric layer present on a substrate with a first gaseous precursor, by CVD, to form nanocrystal nuclei on said surface of said dielectric layer;

ii) contacting said nanocrystal nuclei with a second gaseous precursor, by CVD, to selectively deposit nanocrystal semi-conductor material only on said nuclei and to thereby grow nanocrystals on said nuclei, each nanocrystal having an exposed surface; and iii) forming a nitride layer only on said exposed surface of each nanocrystal by contacting said nanocrystals with a mixture comprising the second gaseous precursor and a third gaseous precursor to terminate the growth of said nanocrystals and to selectively and stoichiometrically deposit said nitride layer on said exposed surface, wherein a material of said nanocrystal nuclei is compatible with a material of said dielectric layer, each of said i), ii) and iii) are carried out in a same chamber, and the first gaseous precursor, the second gaseous precursor and the mixture of the second gaseous precursor with the third gaseous precursor are introduced into the chamber in a continuous flow.

2. The method according to claim 1, further comprising contacting a surface of the dielectric material substrate with HF, HF-RCA or RCA prior to i), thereby forming —OH groups on the surface of said dielectric material substrate.

3. The method according to claim 1, wherein the dielectric material substrate is selected from the group consisting of a silicon thermal oxide, a silicon thermal oxide comprising a high density of Si—OH groups at its surface or a high-K material, a hafnium aluminate and a hafnium silicate.

4. The method according to claim 3, wherein said high-K material is selected from the group consisting of $HfO_2$ and $Al_2O_3$.

5. The method according to claim 3, wherein said high-K material is a material having a permittivity constant of 6 or more.

6. The method according to claim 1, wherein the semiconductor material of the nanocrystals, the nitride layer, or both is selected from the group consisting of silicon, germanium and silicon-germanium SiGe.

7. The method according to claim 6, wherein a material of the nanocrystals is silicon, and a material of the layer covering said nanocrystals is silicon nitride or germanium nitride.

8. The method according to claim 6, wherein a material of the nanocrystals is germanium, and a material of the layer covering said nanocrystals is silicon nitride.

9. The method according to claim 1, wherein said i) contacting is carried out at a deposition temperature and for an exposure time to the first gaseous precursor to obtain a nuclei density of nuclei greater than or equal to $10^{10}$ nuclei per $cm^2$ and nuclei with a size less than or equal to 10 nm.

10. The method according to claim 9, wherein said i) contacting is carried out at a temperature of from 550 to 650° C. and for an exposure time to the first gaseous precursor for a period of 10 seconds to 10 minutes, thereby obtaining a nuclei density of nuclei greater than or equal to $10^{10}$ nuclei per $cm^2$ and nuclei with a size less than or equal to 10 nm.

11. The method according to claim 1, wherein said ii) contacting is carried out at a deposition temperature, for an exposure time to the second gaseous precursor and at a partial pressure of the second gaseous precursor selected according to obtain the desired size of the nanocrystals.

12. The method according to claim 1, wherein the first gaseous precursor is selected from the group consisting of silane, disilane and trisilane.

13. The method according to claim 1, wherein the second gaseous precursor comprises germane ($GeH_4$), dichlorosilane ($SiH_2Cl_2$) or a mixture thereof.

14. The method according to claim 1, wherein the first and second gaseous precursors are respectively silane and dichlorosilane, and the temperature and the deposition time of the growth step is greater than the temperature and the deposition time of the germination step.

15. The method according to claim 1, wherein the third gaseous precursor is ammonia ($NH_3$).

16. The method according to claim 1, wherein the dielectric material substrate is a thermal silicon oxide, and said iii) forming is carried out during a deposition time of the gas, formed by a mixture of the second gaseous precursor and the third gaseous precursor, of less than 8 minutes.

17. A memory cell comprising a structure comprising nano-structures of semiconductor material present on a substrate of dielectrical material and covered by a semiconductor material nitride, said structure obtained by the process of claim 1 and the nano-structures of the structure forming the floating gate of the memory cell.

18. A flash memory comprising at least one memory cell as claimed in claim 17.

19. The method according to claim 1, wherein said mixture of said forming consists of at least one of $SiH_2Cl_2$, $GeH_4$, $GeCl_2$ as the second gaseous precursor and $NH_3$ as the third gaseous precursor.

20. The method according to claim 1, wherein said first gaseous precursor consists of trisilane.

* * * * *